United States Patent
Choi et al.

(10) Patent No.: US 8,716,043 B2
(45) Date of Patent: May 6, 2014

(54) METHOD FOR MANUFACTURING SEMICONDUCTOR LIGHT EMITTING DIODE

(75) Inventors: Pun Jae Choi, Kyungki-do (KR); Sang Yeob Song, Seoul (KR); Suk Youn Hong, Kyungki-do (KR)

(73) Assignee: Samsung Electronics Co., Ltd., Seoul (KR)

( * ) Notice: Subject to any disclaimer, the term of this patent is extended or adjusted under 35 U.S.C. 154(b) by 902 days.

(21) Appl. No.: 12/881,440

(22) Filed: Sep. 14, 2010

(65) Prior Publication Data

US 2010/0330717 A1    Dec. 30, 2010

Related U.S. Application Data

(62) Division of application No. 11/594,758, filed on Nov. 9, 2006, now Pat. No. 7,872,266.

(30) Foreign Application Priority Data

Dec. 28, 2005    (KR) .................. 10-2005-0132250

(51) Int. Cl.
*H01L 21/00*    (2006.01)
(52) U.S. Cl.
USPC .......................................................... 438/29
(58) Field of Classification Search
USPC .................. 257/E33.025, E33.028, E33.033; 438/29
See application file for complete search history.

(56) References Cited

U.S. PATENT DOCUMENTS

| | | | |
|---|---|---|---|
| 5,370,944 A * | 12/1994 | Omori et al. ................. | 428/565 |
| 5,981,977 A | 11/1999 | Furukawa et al. | |
| 6,320,209 B1 * | 11/2001 | Hata et al. ..................... | 257/190 |
| 7,087,932 B2 | 8/2006 | Okuyama et al. | |
| 7,122,394 B2 | 10/2006 | Okuyama et al. | |
| 7,446,344 B2 * | 11/2008 | Fehrer et al. .................... | 257/95 |
| 2002/0117677 A1 * | 8/2002 | Okuyama et al. ............... | 257/94 |
| 2003/0180977 A1 | 9/2003 | Suzuki et al. | |
| 2004/0048409 A1 * | 3/2004 | Biwa et al. ..................... | 438/46 |
| 2004/0137723 A1 * | 7/2004 | Noma et al. ................... | 438/667 |
| 2005/0017258 A1 * | 1/2005 | Fehrer et al. ................... | 257/98 |
| 2006/0157717 A1 * | 7/2006 | Nagai et al. .................... | 257/81 |
| 2006/0166478 A1 * | 7/2006 | Sugahara et al. ............. | 438/602 |
| 2007/0236130 A1 * | 10/2007 | Ito et al. ........................ | 313/495 |

OTHER PUBLICATIONS

United States Office Action issued in U.S. Appl. No. 11/594,758, mailed Sep. 29, 2010.

* cited by examiner

*Primary Examiner* — Bilkis Jahan
(74) *Attorney, Agent, or Firm* — McDermott Will & Emery LLP (57) ABSTRACT

A high-efficiency semiconductor light emitting diode and a method for manufacturing the same are provided. The semiconductor LED has high internal quantum efficiency and can reduce the bad effect caused by the crystal defect. In the semiconductor light emitting diode, a conductive substrate has a three-dimensional top surface, and a light-emitting stack structure has a three-dimensional structure and includes an n-type nitride semiconductor layer, an active layer, and a p-type nitride semiconductor layer, which are sequentially formed on the conductive substrate. A p-electrode is formed on the p-type nitride semiconductor layer, and an n-electrode is formed on a bottom surface of the conductive substrate.

15 Claims, 11 Drawing Sheets

Prior art

METHOD FOR MANUFACTURING SEMICONDUCTOR LIGHT EMITTING DIODE

RELATED APPLICATIONS

This application is a Divisional of U.S. application Ser. No. 11/594,758, filed on Nov. 9, 2006 now U.S. Pat. No. 7,872,266, claiming priority of Korean Patent Application No. 10-2005-0132250, filed on Dec. 28, 2005, the entire contents of each of which are hereby incorporated by reference.

BACKGROUND OF THE INVENTION

1. Field of the Invention

The present invention relates to a semiconductor light emitting diode (LED), and more particularly, to a high-efficiency nitride semiconductor LED with a three-dimensional light-emitting stack structure.

2. Description of the Related Art

Recently, display devices and illuminating devices using semiconductor LEDs such as GaN-based LEDs have been actively developed for low power, high efficiency, high color reproduction, fast response speed, and environmental affinity. Since the semiconductor LED does not reach 80 lm/W, which is the efficiency of a fluorescent lamp, it does not still replace the fluorescent lamp used for general illumination. The semiconductor LED is used in a light source for a keypad of a mobile phone, an LCD backlight, a camera flash, a traffic light, and so on. Therefore, in order to develop a semiconductor LED for illumination, the low efficiency of the semiconductor LED must be increased. Especially, many attempts have been made to increase the efficiency of the semiconductor LED through an epitaxial growth and an improved package structure.

An internal quantum efficiency is determined by the number of photons generated at an active layer with respect to carriers injected to the LED. The internal quantum efficiency is expressed as a product of an injection efficiency and a radiative efficiency. The injection efficiency is defined by the ratio of carriers injected into quantum well of the active layer to carriers injected into the LED, and the radiative efficiency, is defined by the ratio of photons generated by the carriers injected into the quantum well. The internal quantum efficiency is varied according to a peak wave and an operating current density. Specifically, as the operating current density increases, the internal quantum efficiency decreases. It has been known that this phenomenon is caused by carrier overflowing phenomenon and a reduced recombination efficiency due to the increase of a piezoelectric field at the quantum well.

To solve the low internal quantum efficiency, the operating current density is reduced by increasing the area of the semiconductor LED chip. However, if the size of the semiconductor LED chip is reduced, the price of the LED increases and its yield rapidly decreases. Thus, the reduction in the size of the semiconductor LED chip is not an approach suitable for improving the internal quantum efficiency. Recently, in order to increase the area of the active layer without changing the chip size, a method of forming a three-dimensional light-emitting stack structure using a selective epitaxial growth has been introduced.

Figure 1:
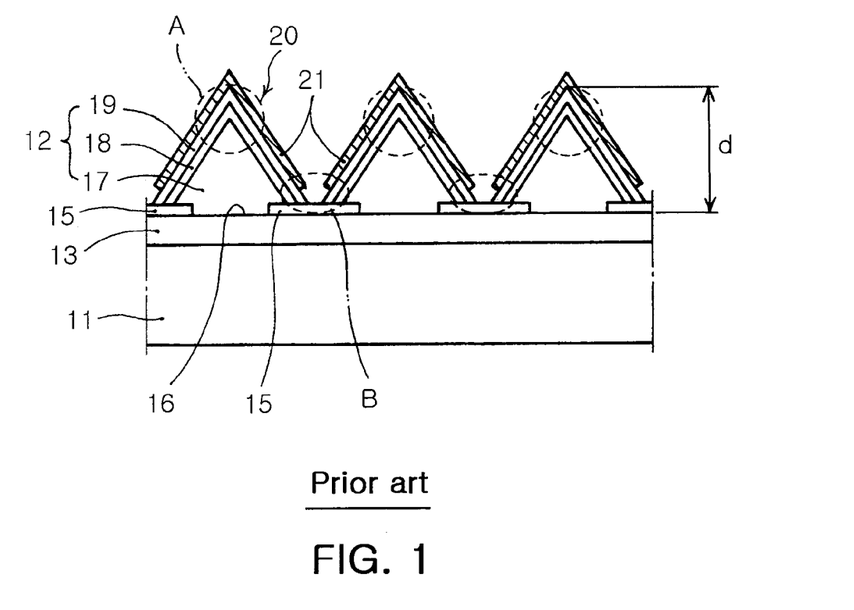
FIG. 1 is a sectional view of a conventional semiconductor LED.

FIG. 1 is a sectional view of a conventional semiconductor LED. Referring to FIG. 1, a conventional semiconductor LED 10 includes a GaN layer 13 formed on a sapphire substrate 11 and a three-dimensional light-emitting stack structure 20 formed on the GaN layer 13. The three-dimensional light-emitting stack structure 20 is formed in a pyramid shape. The pyramid-shaped light-emitting stack structure 20 may be formed by selectively growing an n-type GaN crystal using a $SiO_2$ mask 15 to form a pyramid-shaped GaN layer 17, and growing an active layer 18 and a p-type GaN layer 19 on the n-type GaN layer 17. By forming the three-dimensional light-emitting stack structure (specifically, the three-dimensional active layer 19), the area of the active layer 19 can be increased without changing the chip size and the operating current density can be decreased.

However, if the three-dimensional (e.g., pyramid-shaped) light-emitting stack structure is formed using the selective growth, the grown three-dimensional structure has a very small size of less than several μm, and a crystal defect occurs at an apex A and a valley B of the pyramid. Since the thickness (d) of the pyramid is very small, the crystal defect at the apex A and the valley B will influence other parts. Therefore, the light-emission wavelength becomes non-uniform and it is difficult to obtain the intended wavelength. In addition, because the thickness (d) of the pyramid is too small, it is difficult to prevent the bad effect due to the crystal defect generated at the apex A or the valley B of the pyramid by using the manufacturing technique.

SUMMARY OF THE INVENTION

Accordingly, the present invention is directed to a semiconductor LED and a method for manufacturing the same that substantially obviate one or more problems due to limitations and disadvantages of the related art.

An object of the present invention is to provide a high-efficiency semiconductor LED having a three-dimensional light-emitting stack structure, which can reduce the bad effect caused by the crystal defect.

Another object of the present invention is to provide a method for manufacturing a high-efficiency semiconductor LED, which can reduce or suppress the bad effect caused by the crystal defect existing within a three-dimensional light-emitting stack structure.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, there is provided a semiconductor LED, including: a conductive substrate having a three-dimensional top surface; a light-emitting stack structure having a three-dimensional structure and including an n-type nitride semiconductor layer, an active layer, and a p-type nitride semiconductor layer, which are sequentially formed on the conductive substrate; a p-electrode formed on the p-type nitride semiconductor layer; and an n-electrode formed on a bottom surface of the conductive substrate.

The conductive substrate may be one of a nitride semiconductor substrate and a SiC substrate. The conductive substrate may have a thickness of more than 50 μm, and the three-dimensional structure may have a thickness of 10-1000 μm.

The active layer may include at least one of c-plane, a-plane, and n-plane. In this case, the active layer can have a good-quality crystal.

The p-electrode may be selectively formed only in regions except portions in which planes of the three-dimensional structure are interested.

The light-emitting stack structure may be removed at the portions in which the planes of the three-dimensional structure are intersected. A $SiO_2$ passivation layer may be formed at the portions in which the light-emitting stack structure is removed.

The conductive substrate may include a groove at the bottom surface in order to reduce a thickness deviation of the conductive substrate. Also, the conductive substrate may have an uneven bottom surface to provide a roughness.

The light-emitting stack structure may have a trapezoidal pyramid structure. In this case, the p-electrode may be electively formed in regions except edge portions of the trapezoidal pyramid structure. Also, the edge portions of the trapezoidal pyramid structure may be removed. A $SiO_2$ passivation layer may be formed at the portions in which the edge portions are removed.

The light-emitting stack structure may have a pyramid structure whose edges are removed. In this case, the active layer may not be formed on a top surface of the pyramid structure. A $SiO_2$ passivation layer may be formed on the top surface of the pyramid structure.

According to another aspect of the present invention, there is provided a method for manufacturing a semiconductor LED, including the steps of: a) preparing a conductive substrate whose top surface has a plurality of three-dimensional shapes; b) sequentially growing an n-type nitride semiconductor layer, an active layer, and a p-type nitride semiconductor layer on the conductive substrate, thereby forming a three-dimensional light-emitting stack structure; c) forming a plurality of p-electrodes on the p-type nitride semiconductor layer; d) forming a plurality of n-electrodes on a bottom surface of the conductive substrate; and e) separating the resulting structure into individual devices.

The conductive substrate may have a thickness of more than 50 μm. The step a) may be carried out such that the top surface of the conductive substrate has a three-dimensional shape of 10-1000 μm in thickness. The step a) may be carried out using a wheel or a diamond pencil.

The active layer may be grown to include at least one of c-plane, a-plane, and n-plane in the step b).

In the step c), the p-electrode may be selectively formed only in regions except portions in which planes of the three-dimensional structure are intersected.

The method may further include, between the step b) and the step c), the step of removing the portions (edge, apex, valley) in which the planes of the light-emitting stack structure are intersected. The method may further include the step of forming a $SiO_2$ passivation layer at the removed portions.

Prior to the step d), the method may further include the step of forming a groove at the bottom surface of the conductive substrate in order to reduce a thickness deviation of the conductive substrate. The method may further include the step of processing the conductive substrate to have an uneven bottom surface in order to provide a roughness.

The step a) may be carried out such that a top surface of the conductive substrate has a plurality of trapezoidal pyramid structures. In this case, after the step b), the method may further include the step of removing predetermined portions of the light-emitting structure that are formed at edges of the trapezoidal pyramid structures. A passivation layer may be formed at the edge portions after removing the predetermined portions of the light-emitting stack structure.

The step a) may be carried out such that the conductive substrate has a plurality of V-shaped grooves on a top surface thereof. In this case, after the step b), the method may further include the step of removing predetermined portions of the light-emitting stack structure that are formed at apexes and valleys of the V-shaped grooves. A passivation layer may be formed at the removed portions.

According to the present invention, the substrate itself (especially, the top surface of the substrate) has the three-dimensional shape. Thus, the light-emitting stack structure (the n-type nitride semiconductor layer, the active layer, and the p-type nitride semiconductor layer) grown on the substrate also has the three-dimensional structure. Therefore, it is easy to form the light-emitting stack structure with the three-dimensional structure having the thickness of more than several tens μm. In addition, the bad effect caused by the crystal defect existing in the edges or apexes of the three-dimensional structure can be easily suppressed. Moreover, by forming the active layer with the three-dimensional structure, the semiconductor LED can have the increased internal quantum efficiency without changing the chip size.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. The same reference numerals are used to refer to the same elements throughout the drawings.

Figure 2:
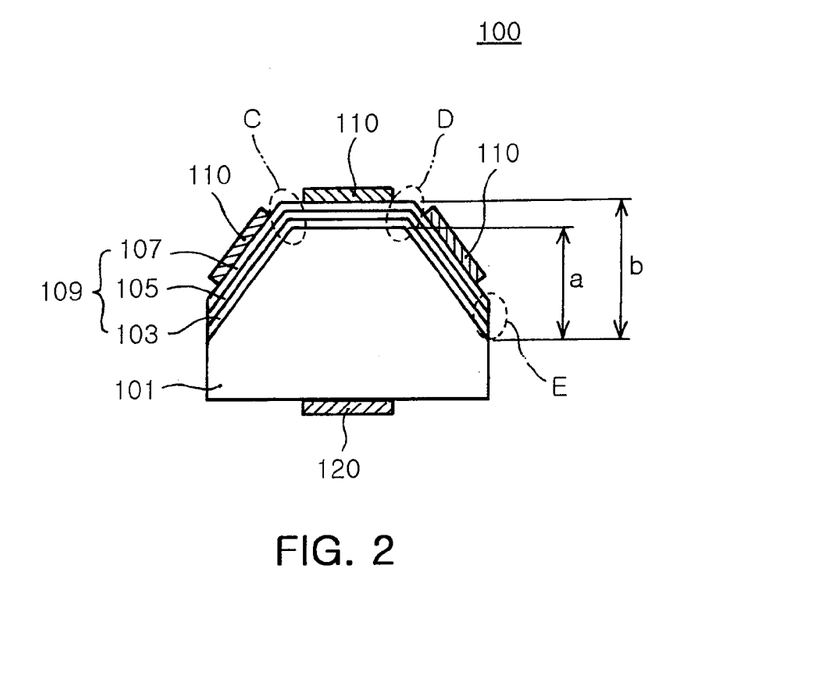
FIG. 2 is a sectional view of a semiconductor LED according to a first embodiment of the present invention.

FIG. 2 is a sectional view of a semiconductor LED according to a first embodiment of the present invention.

Referring to FIG. 2, the semiconductor LED 100 according to the first embodiment of the present invention includes a GaN-based substrate 101 and a light-emitting stack structure 109 formed on the GaN-based substrate 101. The GaN-based substrate 101 has a top surface having a three-dimensional shape. Specifically, the GaN-based substrate 101 is formed in a trapezoidal pyramid shape. The light-emitting stack structure 109 includes an n-type nitride semiconductor layer 103, an active layer 105, and a p-type nitride semiconductor layer 107, which are sequentially formed on the substrate 101.

A p-electrode 110 is formed on the p-type nitride semiconductor layer 107, and an n-electrode is formed on the bottom surface of the substrate 101. Preferably, the bottom surface of the substrate 101 becomes a light exit surface. Therefore, the p-electrode 110 may include an ohmic-contact metal layer and a reflective metal layer formed on the ohmic-contact metal layer.

Because the light-emitting stack structure 109 basically has the three-dimensional structure, a wider area of the active layer 105 can be secured without increasing the chip size. Thus, the operating current density is decreased and the internal quantum efficiency is increased. Due to the increased internal quantum efficiency, the semiconductor LED 100 can be used for a general illumination.

It is preferable that the substrate 101 has a thickness of more than 50 μm so that its upper portion can be formed in a three-dimensional shape having a thickness (a) of more than several tens μm. Also, it is preferable that the three-dimensional structure forming the light-emitting stack structure 109 has a thickness (b) of 10-1000 μm. Because the top surface of the substrate 101 has the three-dimensional shape, it is easy to form the light-emitting stack structure 109 in the three-dimensional shape having a thickness of several hundreds μm to several hundreds μm.

Generally, the three-dimensional light-emitting stack structure has relatively many defects at portions in which planes off the three-dimensional structures are intersected, for example, an edge, an apex, and a valley. Because the light-emitting stack structure with the three-dimensional structure having a thickness of several tens μm can be easily formed, the portions having relatively many crystal defects (the portions in which the planes of the three-dimensional structures are intersected) can be easily processed. For example, the edge of the three-dimensional structure may be easily removed using an etching process.

In addition, because the three-dimensional structure formed by the light-emitting stack structure 109 has a thickness of more than several tens μm, the bad effect of the crystal defect at other portions can be relatively reduced. Therefore, the semiconductor LED according to the present invention can reduce the crystal defect and obtain the high-efficiency output light.

Preferably, the active layer includes at least one of c-plane, a-plane, and n-plane and thus can obtain good crystal quality. In order to form the active layer having these crystal planes, the upper surface of the GaN-based substrate 101 having the three-dimensional structure must include at least one of the c-plane, the a-plane, and the n-plane.

Referring to FIG. 2, the p-electrodes 110 are selectively formed only on the regions except the edge portions C, D and E having the relatively high crystal defect density. Therefore, a current flows through only regions having good crystal quality in the active layer. Consequently, the leakage current can be reduced and the luminous efficiency can be more improved. The selective formation of the p-electrode only at the regions except the edge portions C, D and E corresponds to the process of suppressing the bad effect caused by the crystal defect.

Figure 3:
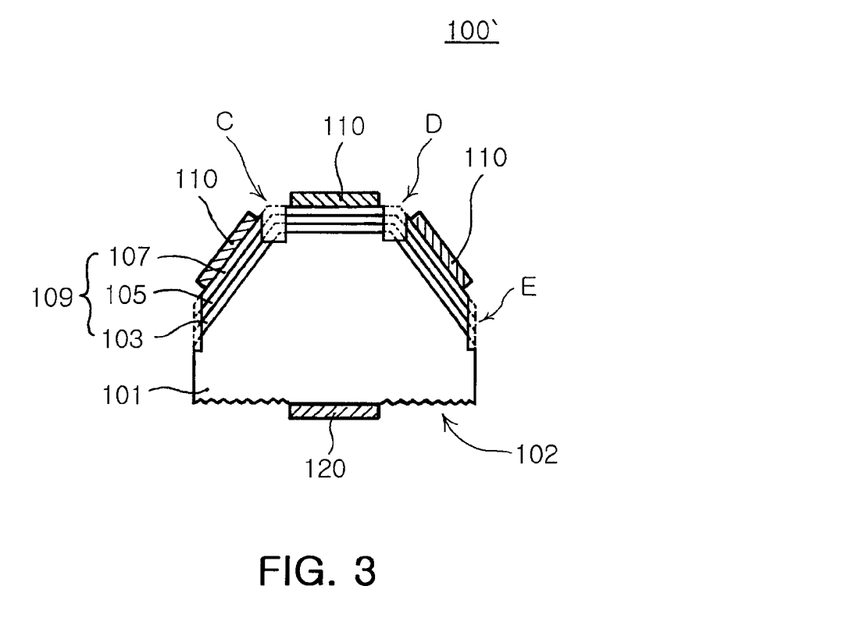
FIG. 3 is a sectional view of a semiconductor LED according to a second embodiment of the present invention.

FIG. 3 is a sectional view of a semiconductor LED according to a second embodiment of the present invention. In the semiconductor LED 100' of FIG. 3, edges C, D and E of a three-dimensional light-emitting stack structure are removed using an etching process. By removing the edges C, D and E, a large amount of crystal defect existing in the edges is also removed. Thus, the bad effect caused by the crystal defect can be reduced or suppressed. A passivation layer (150 in FIG. 12) may be formed at the regions where the edges C, D and E are removed. The passivation layer may be formed of insulating material such as $SiO_2$. The passivation layer can prevent the p-electrode 110 and the active layer 105 from being directly contacted with each other and can interrupt a undesired current flowing through the edges C, D and E.

The GaN-based substrate 101 may have an uneven bottom surface 102, which is a light exit surface. The uneven bottom surface 102 provides a roughness. The uneven bottom surface 102 reduces the total reflection caused by a difference of refractive index between the substrate 101 and an external environment (for example, air or molding resin), thereby increasing the light extraction efficiency.

Figure 4:
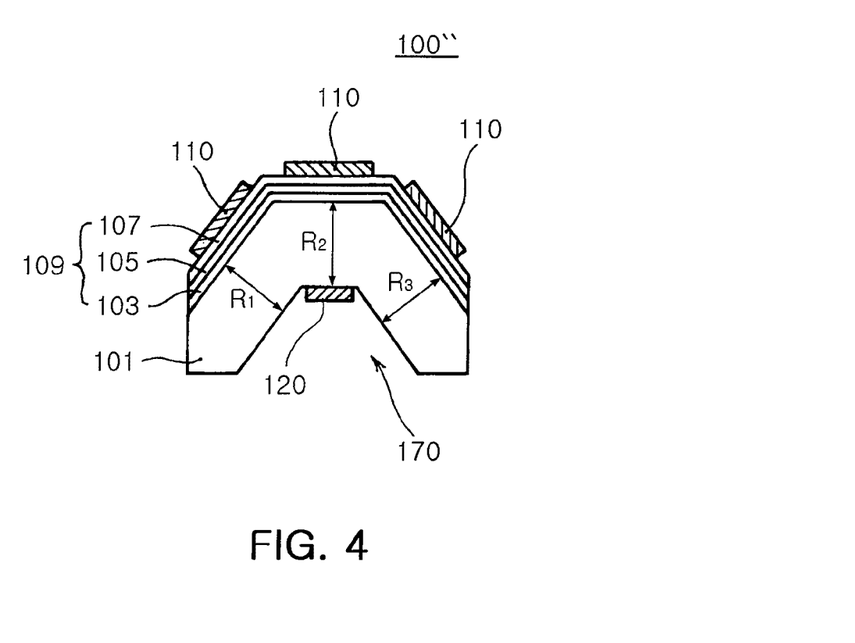
FIG. 4 is a sectional view of a semiconductor LED according to a third embodiment of the present invention.

FIG. 4 is a sectional view of a semiconductor LED according to a third embodiment of the present invention. In the semiconductor LED 100" of FIG. 4, a groove 170 is formed in a bottom surface of a substrate 101. The groove 170 reduces a deviation of thickness $R_1$, $R_2$ and $R_3$ of the substrate 101. Because a deviation of current paths passing through the substrate 101 is reduced, the current can flow more uniformly. Consequently, the operating voltage is lowered and a local concentration of the current density can be prevented. That is, the groove 170 formed in the bottom surface of the substrate 101 functions to accelerate a current diffusion. The semiconductor LED 100" also has the above-described advantages.

Figure 5:
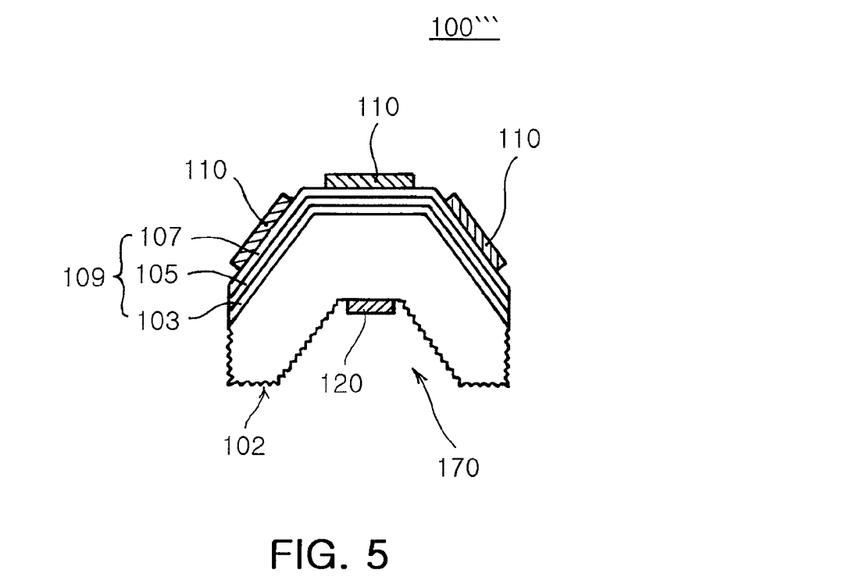
FIG. 5 is a sectional view of a semiconductor LED according to a fourth embodiment of the present invention.

FIG. 5 is a sectional view of a semiconductor LED according to a fourth embodiment of the present invention. Referring to FIG. 5, a groove 170 is formed in a bottom surface of a substrate 101 so as to reduce a thickness deviation of the substrate 101. Also, the substrate 101 has an uneven bottom surface 102. Due to the groove 170 and the uneven bottom surface 102, the semiconductor LED 100''' according to the fourth embodiment of the present invention can simultaneously improve the light extraction efficiency and the current uniformity.

Figure 6:
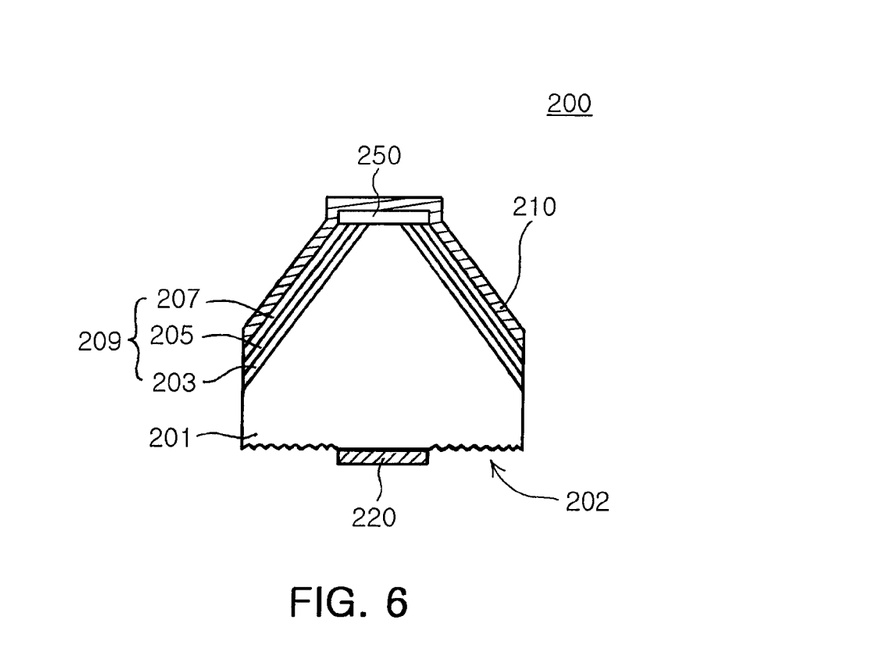
FIG. 6 is a sectional view of a semiconductor LED according to a fifth embodiment of the present invention.

FIG. 6 is a sectional view of a semiconductor LED according to a fifth embodiment of the present invention. Referring to FIG. 6, the semiconductor LED 200 according to the fifth embodiment of the present invention includes a GaN-based substrate 201 and a light-emitting stack structure 209. A top surface of the GaN-based substrate 201 is formed in a pyramid shape (specifically, a pyramid shape whose top apex is removed. The light-emitting stack structure 209 includes an n-type nitride semiconductor layer 203, an active layer 205, and a p-type nitride semiconductor layer 207, which are sequentially formed on the pyramid-shaped substrate 201. The light-emitting stack structure 209 also has a pyramid shape.

As illustrated in FIG. 6, the active layer is not formed on the pyramid-shaped top surface of the light-emitting stack structure 209. If the light-emitting stack structure 209 has an apex of the pyramid, relatively many crystal defects will exist in the active layer formed in the apex of the pyramid. By removing such an active layer formed in the apex of the pyramid, the bad effect caused by the crystal defects can be reduced or suppressed. Furthermore, the substrate 201 may have an uneven bottom surface 202 in order to increase the light extraction efficiency.

The semiconductor LED 200 may further include a passivation layer 250 on the top surface exposed by removing the apex of the pyramid. The passivation layer 250 interrupts a current flowing through the top surface of the pyramid structure and prevents the contact between the p-electrode 210 and the active layer 250. The passivation layer 250 may be formed of insulating material, such as $SiO_2$ or $SiN_x$.

The semiconductor LED 200 according to the fifth embodiment of the present invention can obtain the advantages of the semiconductor LED 100 according to the first embodiment of the present invention. That is, because the light-emitting stack structure 209 has the three-dimensional structure (especially, pyramid structure), the operating current density decreases and the internal quantum efficiency increases. Also, because the top surface of the substrate 201 has the three-dimensional shape, the light-emitting stack structure 209 with the three-dimensional structure having a thickness of several tens μm to several hundreds μm can be easily obtained. Therefore, the bad effect caused by the crystal defect can be reduced and the area of the active layer can be increased.

Although the GaN-based substrate is used in the above-described embodiments, the present invention is not limited to the GaN-based substrate. Any conductive substrates can be used if they are usable for manufacture the nitride semiconductor LED. For example, a SiC substrate may be used.

Hereinafter, methods for manufacturing the semiconductor LEDs according to various embodiments of the present invention will be described in detail with reference to FIGS. 7 to 22. The manufacturing methods can be used to obtain a plurality of LED chips from a wafer-level substrate.

FIGS. 7 to 12 are sectional views illustrating a method for manufacturing a semiconductor LED according to a first embodiment of the present invention.

Figure 7:
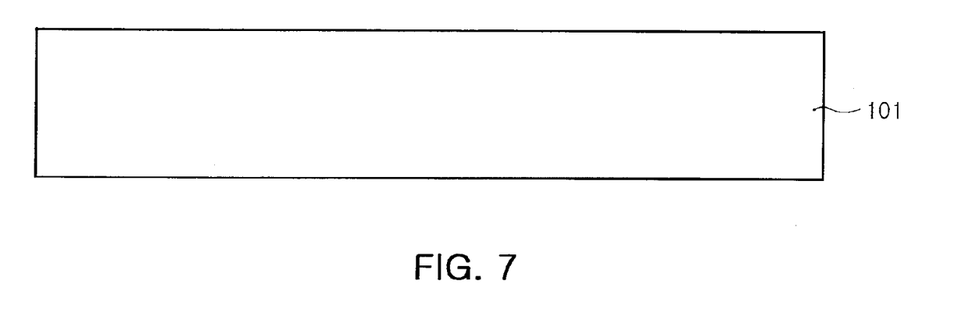
FIGS. 7 to 12 are sectional views illustrating a method for manufacturing a semiconductor LED according to a first embodiment of the present invention.
Figure 8:
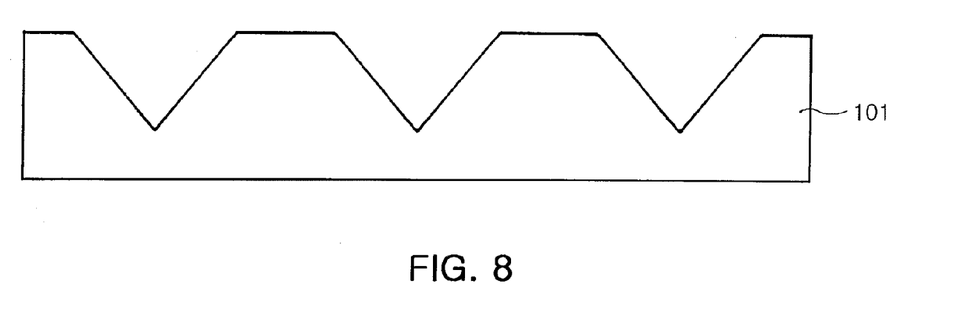

Referring to FIG. 7, a GaN-based substrate 101 is prepared. Instead of the GaN-based substrate, other conductive substrates such as a SiC substrate may be used. It is preferable that the conductive substrate has a thickness of more than 50 μm. Referring to FIG. 8, the GaN-based substrate 101 is processed such that its top surface has a plurality of three-dimensional shapes. For example, a plurality of trapezoidal pyramid structures may be formed on the top surface of the substrate 101 by sawing the substrate 101 using a wheel, or scribing the substrate 101 using a diamond pencil.

It is preferable that the substrate is processed to have the three-dimensional shape of 10-100 μm in size. Also, it is preferable that the top surface of the processed substrate has at least one of c-plane, a-plane, n-plane. The reason for this is that the nitride semiconductor layer can be grown later on the c-plane, the a-plane, or the n-plane.

Figure 9:
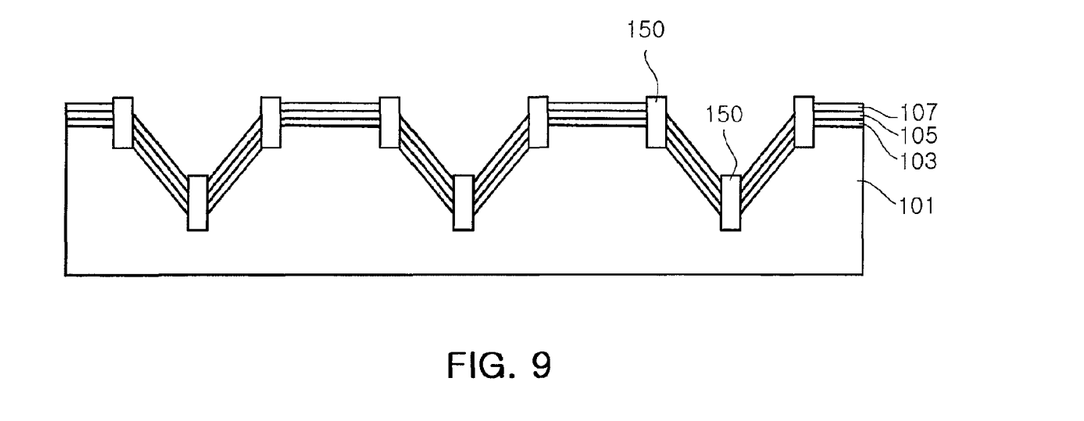

Referring to FIG. 9, an n-type nitride semiconductor layer 103, an active layer 105, and a p-type nitride semiconductor layer 107 are epitaxially grown in sequence on the substrate 101. Accordingly, the light-emitting stack structures 103, 105 and 107 having the three-dimensional structures (especially, a plurality of trapezoidal pyramid structures) can be formed on the substrate 101. Preferably, the active layer 105 is grown on at least one of the c-plane, the a-plane, and the n-plane. Then, the edges of the trapezoidal pyramid structures are removed using an etching process. At this time, considerable crystal defects are also removed. A $SiO_2$ passivation layer 150 is formed in the portion in which the edges are removed.

Figure 10:
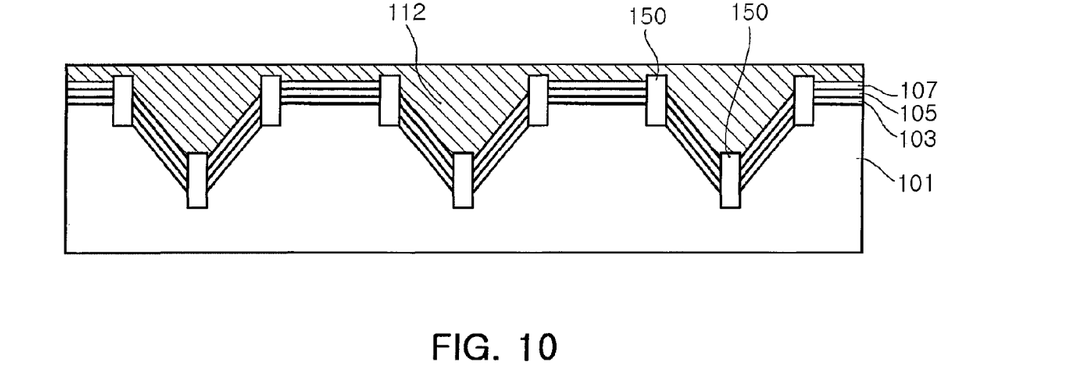

Referring to FIG. 10, a p-electrode 112 is formed on the p-type nitride semiconductor layer 107. The p-electrode 112 may have a multi-layer structure of an ohmic-contact metal layer and a reflective metal layer. Unlike in FIG. 10, the p-electrode 112 may be formed to have a small thickness along the three-dimensional shape of the light-emitting stack structure (see FIG. 3).

Figure 11:
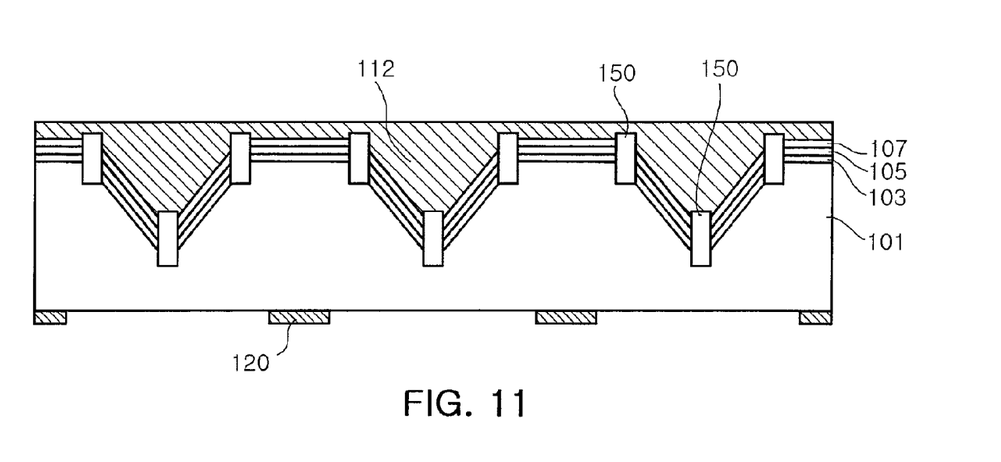
Figure 12:
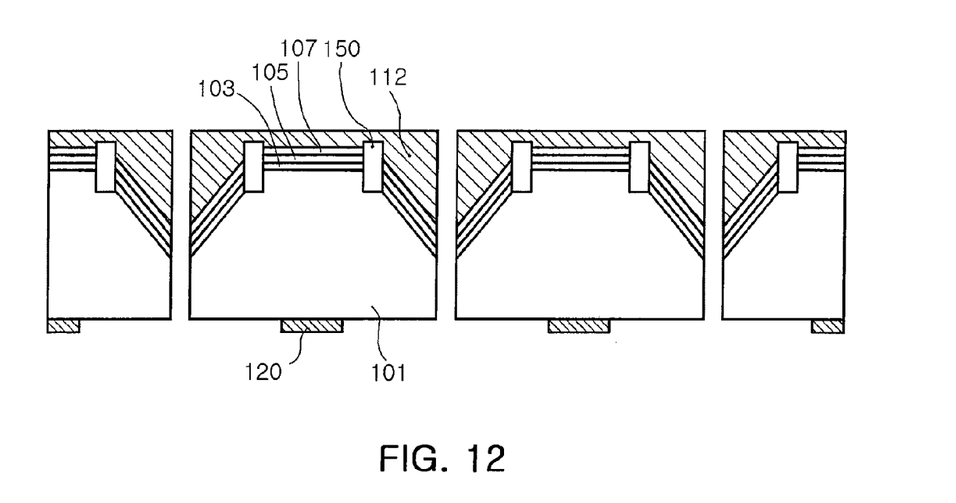

Referring to FIG. 11, an n-electrode 120 is formed on the bottom surface of the substrate 101. Referring to FIG. 12, the resulting structure in which the n-electrode 120 is formed is separated or cut into individual devices by a dicing process, thereby obtaining a plurality semiconductor LEDs. Before the n-electrode 120 is formed, the substrate 101 may be processed to have an uneven bottom surface in order to provide the roughness (see FIG. 3).

Although the passivation layer 150 is formed after removing the edges in this embodiment, the p-electrode can be selectively formed only in the regions except the edge portions without removing the edges (see FIG. 2).

Figure 13:
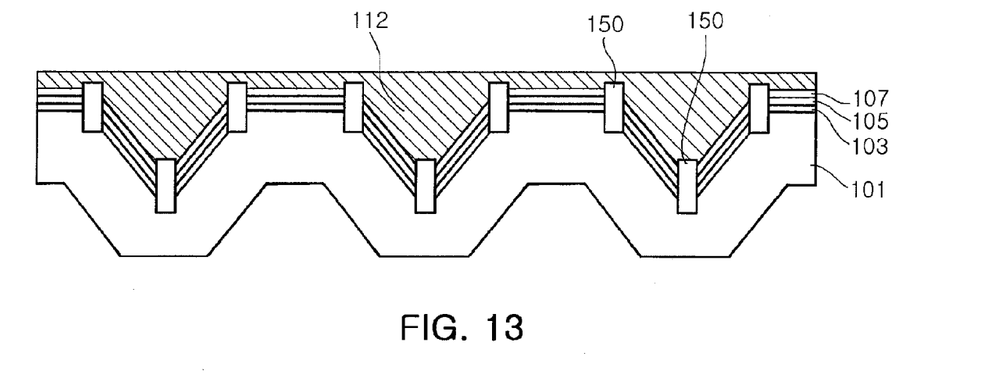
FIGS. 13 to 15 are sectional views illustrating a method for manufacturing a semiconductor LED according to a second embodiment of the present invention.
Figure 14:
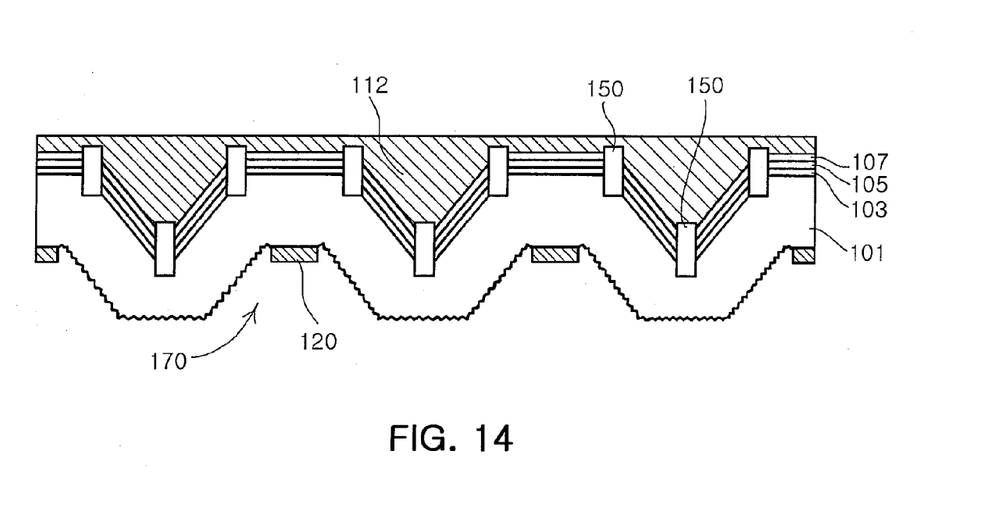
Figure 15:
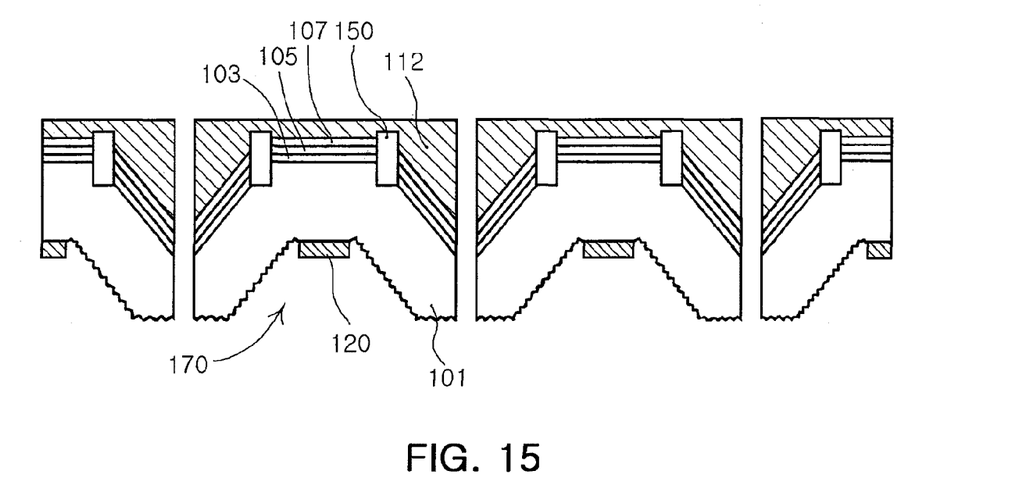

FIGS. 13 to 15 are sectional views illustrating a method for manufacturing a semiconductor LED according to a second embodiment of the present invention. This method can be used to manufacture the semiconductor LED 100''' of FIG. 5. In this case, the step of removing the edges and the step of forming the passivation layer 150 may be selectively carried out.

Referring to FIG. 13, after the manufacturing steps described with reference to FIGS. 7 to 10, the bottom surface of the substrate 101 is processed to form a groove in order to reduce the thickness deviation of the substrate 101. This step may be carried out before forming the light-emitting stack structures 103, 105 and 107, or forming the p-electrode 112.

Referring to FIG. 14, the substrate 201 with the groove 170 is processed to have an uneven bottom surface in order to provide the roughness, and n-electrodes 120 are formed. Referring to FIG. 15, the resulting structure is separated Or cut into individual devices, thereby obtaining a plurality of semiconductor LEDs. In some cases, the step of forming the uneven bottom surface may be omitted (see FIG. 4).

In this embodiment, the step of removing the edges and the step of forming the passivation layer can be omitted, and the p-electrode can be selectively formed only in the regions except the edge portions.

FIGS. 16 to 22 are sectional views illustrating a method for manufacturing a semiconductor LED according to a third embodiment of the present invention. This embodiment can be used to manufacture the semiconductor LED 200 of FIG. 6.

Figure 16:
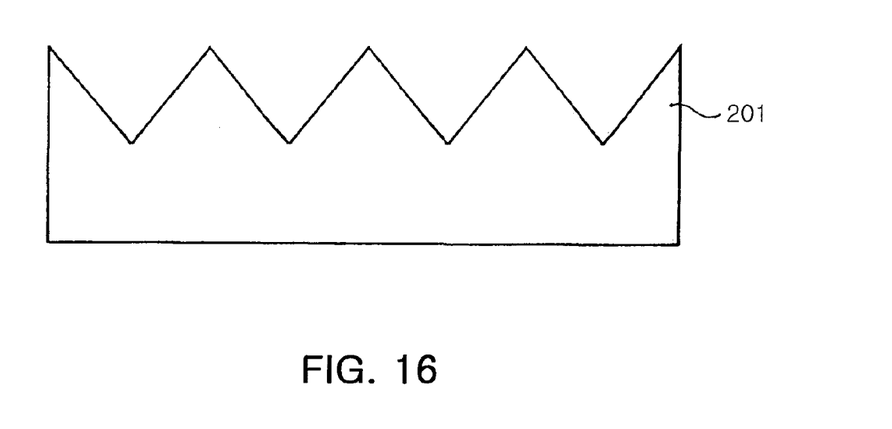
FIGS. 16 to 22 are sectional views illustrating a semiconductor LED according to a third embodiment of the present invention.
Figure 17:
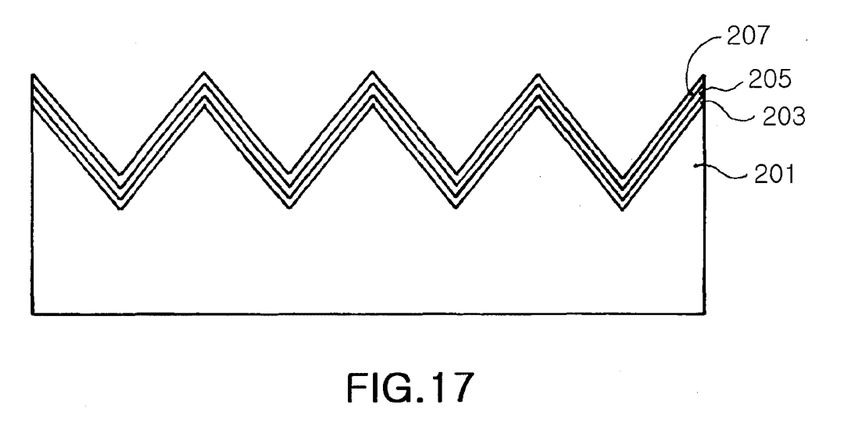

Referring to FIG. 16, a GaN-based substrate 201 is processed such that a plurality of V-shaped grooves are formed on the top surface of the substrate 201. Thus, a plurality of pyramid shapes (three-dimensional shapes) are formed on the top surface of the substrate 201. Referring to FIG. 17, an n-type nitride semiconductor layer 203, an active layer 205, and a p-type nitride semiconductor layer 207 are grown on the top surface of the substrate 201 to form light-emitting stack structures 203, 205 and 207 in the three-dimensional structure (pyramid structure).

Figure 18:
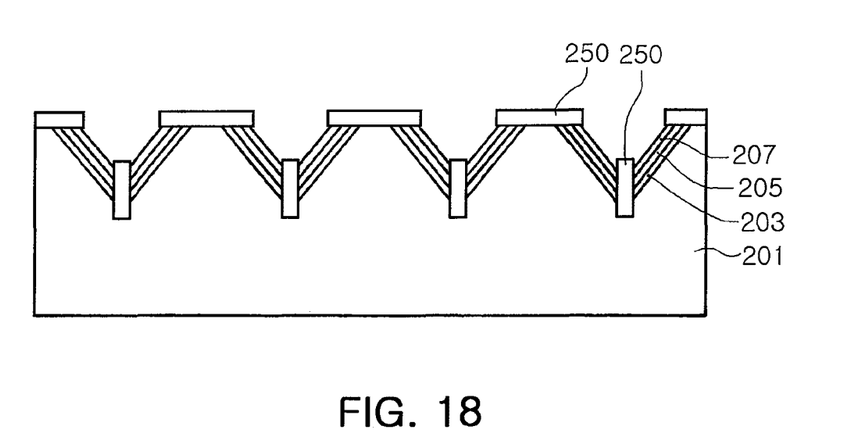

Referring to FIG. 18, portions in which apexes and valleys of the V-shaped grooves are formed are removed using an etching process, and a passivation layer 250 is formed in the removed apexes and valleys.

Figure 19:
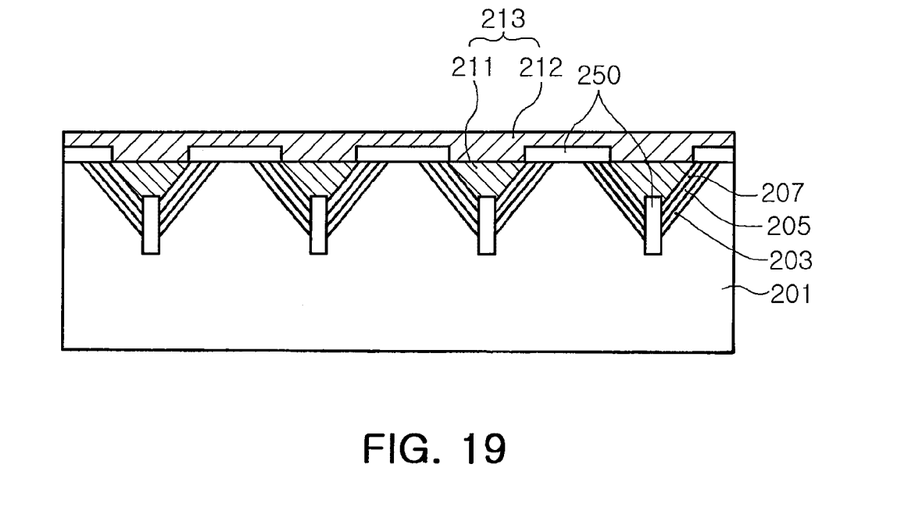

Referring to FIG. 19, a p-electrode 213 is formed on the p-type nitride semiconductor layer 207. The p-electrode 213 may be formed in a stack structure of an ohmic-contact metal layer 211 and a reflective metal layer 212. Unlike in FIG. 19, the p-electrode 213 may be formed to have a small thickness along the light-emitting stack structures (see FIG. 6).

Figure 20:
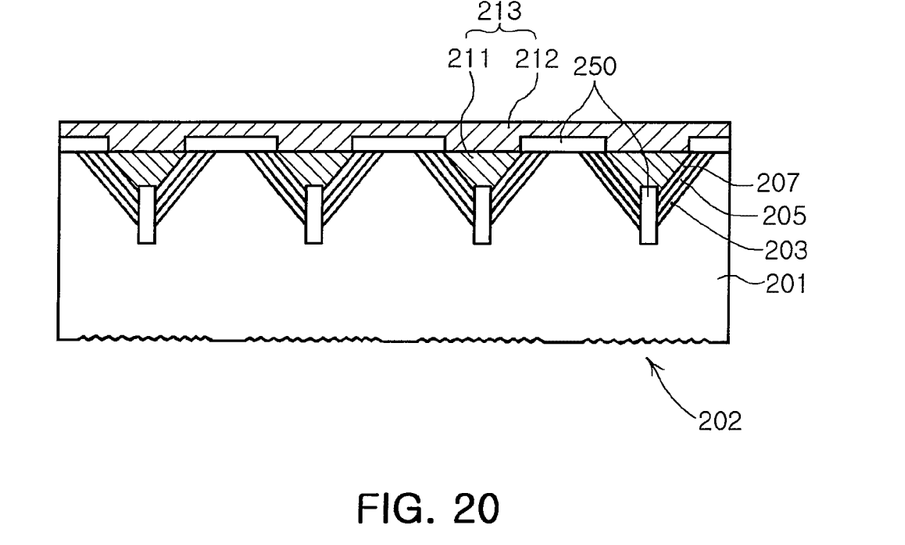
Figure 21:
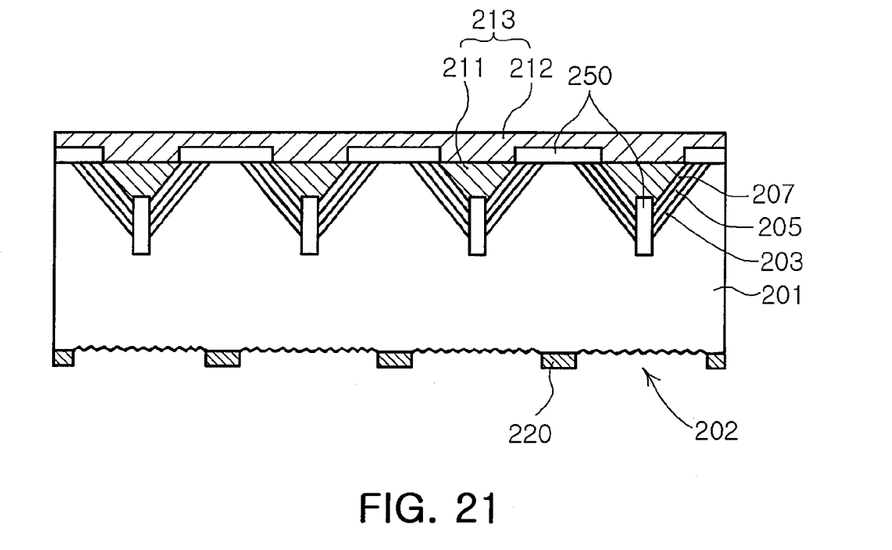
Figure 22:
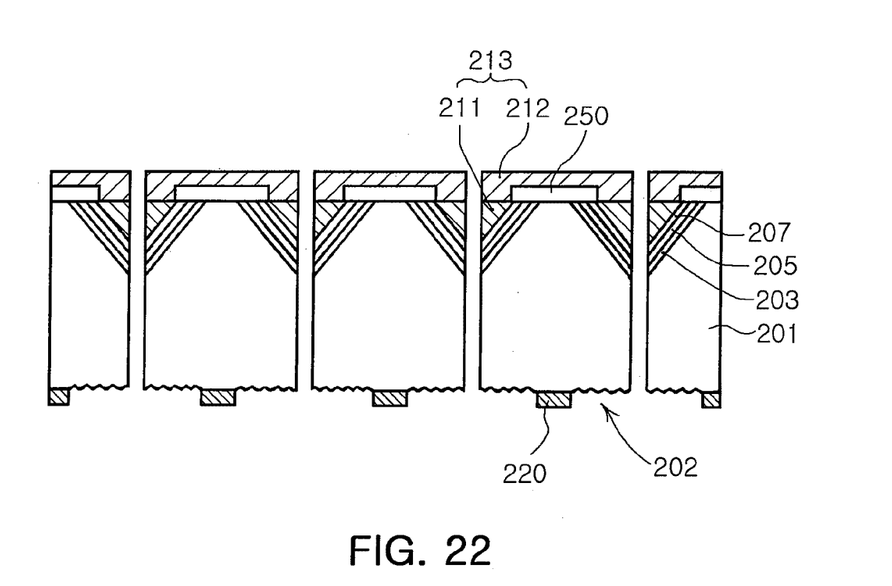

Referring to FIG. 20, the substrate 201 is processed to have an uneven bottom surface 202 to provide the roughness, and n-electrodes 220 are formed. Then, the resulting structure is separated or cut into individual devices, thereby obtaining a plurality of semiconductor LEDs.

By forming the three-dimensional light-emitting stack structure by using the substrate with the three-dimensional shape, the area of the active layer can be increased by 20-100% without increasing the chip size. Therefore, the internal quantum efficiency of the semiconductor LED is increased by 5-40%. In addition, because the operating voltage is reduced as the operating current density is reduced, the power efficiency can be improved by 5-10%. Furthermore, the reduction of the current density increases the lifetime of the LED, improving the reliability of the LED. Because the area of the active layer can be increased without any increase of the chip size, the device having the same performance can be manufactured in a smaller size, thereby reducing the manufacturing cost.

Although the light-emitting stack structures having the trapezoidal pyramid structure or the pyramid structure have been described, the present invention is not limited them. That is, the light-emitting stack structure can have various three-dimensional structures, for example, a stripe structure having a triangular section.

According to the present invention, the substrate is formed in a three-dimensional shape, and the light-emitting stack structure is formed on the substrate. Thus, the light-emitting stack structure can have a wider area without changing the chip size, and the bad effect caused by the crystal defect can be reduced. Therefore, the operating current density is reduced and the internal quantum efficiency is improved. Consequently, the reliability of the LED can be improved. As the operating current density is reduced, the operating voltage is also reduced, thereby improving the power efficiency.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A method for manufacturing a semiconductor light emitting diode, comprising the steps of:
   a) preparing a conductive substrate whose top surface has a plurality of three-dimensional shapes, wherein the three-dimensional shapes comprise a first surface, and second and third surfaces inclined to and intersecting with the first surface;
   b) sequentially growing an n-type nitride semiconductor layer, an active layer, and a p-type nitride semiconductor layer on the first, second, and third surfaces of the conductive substrate, thereby forming a three-dimensional light-emitting stack structure;
   c) forming a plurality of p-electrodes on the p-type nitride semiconductor layer;
   d) forming a plurality of n-electrodes on a bottom surface of the conductive substrate;
   e) removing portions of the light-emitting stack structure to expose the conductive substrate where the second and third surfaces intersect with the first surface; and
   f) separating the resulting structure into individual devices.

2. The method of claim 1, wherein the conductive substrate is one of a gallium nitride (GaN)-based substrate or a SiC substrate.

3. The method of claim 1, wherein the conductive substrate has a thickness of more than 50 µm.

4. The method of claim 1, wherein the step a) is carried out such that the top surface of the conductive substrate has a three-dimensional shape of 10-1000 µm in thickness.

5. The method of claim 1, wherein the step a) is carried out using a wheel.

6. The method of claim 1, wherein the step a) is carried out using a diamond pencil.

7. The method of claim 1, wherein the active layer is grown to include at least one of c-plane, a-plane, and n-plane in the step b).

8. The method of claim 1, further comprising the step of forming a passivation layer at the removed portions.

9. The method of claim 1, further comprising the step of forming a groove at the bottom surface of the conductive substrate before step d) in order to reduce a thickness deviation of the conductive substrate.

10. The method of claim 1, further comprising the step of processing the conductive substrate to have an uneven bottom surface in order to provide a roughness.

11. The method of claim 1, wherein the step a) is carried out such that a top surface of the conductive substrate has a plurality of trapezoidal pyramid structures.

12. The method of claim 1, further comprising the step of forming a passivation layer at edge portions of the light-emitting stack structure after the step e).

13. The method of claim 1, wherein the step a) is carried out such that the conductive substrate has a plurality of V-shaped grooves on a top surface thereof.

14. The method of claim 13, wherein the step e) is performed at apexes and valleys of the V-shaped grooves.

15. The method of claim 14, further comprising the step of forming a passivation layer at the apexes and the valleys after the step e).

* * * * *